(12) United States Patent
Jia et al.

(10) Patent No.: US 10,249,773 B2
(45) Date of Patent: Apr. 2, 2019

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Yuehua Jia, Xiamen (CN); Chun-Yi Wu, Xiamen (CN); Ching-Shan Tao, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 0 days.

(21) Appl. No.: 15/852,696

(22) Filed: Dec. 22, 2017

(65) Prior Publication Data
US 2018/0122992 A1    May 3, 2018

Related U.S. Application Data

(63) Continuation of application No. PCT/CN2016/097805, filed on Sep. 1, 2016.

(30) Foreign Application Priority Data

Nov. 17, 2015  (CN) .......................... 2015 1 0790905

(51) Int. Cl.
| | | |
|---|---|---|
| *H01L 21/00* | (2006.01) | |
| *H01L 29/18* | (2006.01) | |
| *H01L 31/0224* | (2006.01) | |
| *H01L 33/38* | (2010.01) | |
| *H01L 33/40* | (2010.01) | |

(52) U.S. Cl.
CPC ...... *H01L 31/022416* (2013.01); *H01L 33/38* (2013.01); *H01L 33/387* (2013.01); *H01L 33/405* (2013.01); *H01L 2933/0016* (2013.01)

(58) Field of Classification Search
CPC .............................................. H01L 31/022416
USPC ....................................... 257/88; 438/28, 34
See application file for complete search history.

(56) References Cited

FOREIGN PATENT DOCUMENTS

| CN | 104934512 | * | 4/2011 | ............. H01L 33/14 |
| CN | 103890981 | * | 10/2011 | ....... H01L 21/02395 |
| CN | 104934512 A | | 9/2015 | |

* cited by examiner

*Primary Examiner* — Calvin Lee
(74) *Attorney, Agent, or Firm* — Syncoda LLC; Feng Ma (57) ABSTRACT

A light-emitting diode chip includes a first semiconductor layer, a second semiconductor layer and an active layer between them; an dielectric layer having a conductive through-hole array over the lower surface of the light-emitting epitaxial laminated layer; a metal conductive layer over the lower surface of the dielectric layer, which fills up the conductive through-hole, and forms ohmic contact with the light-emitting epitaxial laminated layer; a conductive substrate over the lower surface of the metal conductive layer for supporting the light-emitting epitaxial laminated layer; a first electrode comprising a bonding pad electrode and a finger-shape electrode over the upper surface of the light-emitting epitaxial laminated layer, wherein, a rotation angle is formed between the conductive through-hole array and the finger-shape electrode, which is selected to prevent a preferred number of conductive through-holes from being shielded by the bonding pad electrode and the finger-shape electrode.

20 Claims, 13 Drawing Sheets

LIGHT EMITTING DIODE AND FABRICATION METHOD THEREOF

The present application is a continuation of, and claims priority to, PCT/CN2016/097805 filed on Sep. 1, 2016, which claims priority to Chinese Patent Application No. 201510790905.8 filed on Nov. 17, 2015. The disclosures of these applications are hereby incorporated by reference in their entirety.

BACKGROUND

In recent years, light-emitting diode (LED) is widely applied and plays an increasingly important role in various fields like display system, lighting system and automobile tail light.

Figure 1:
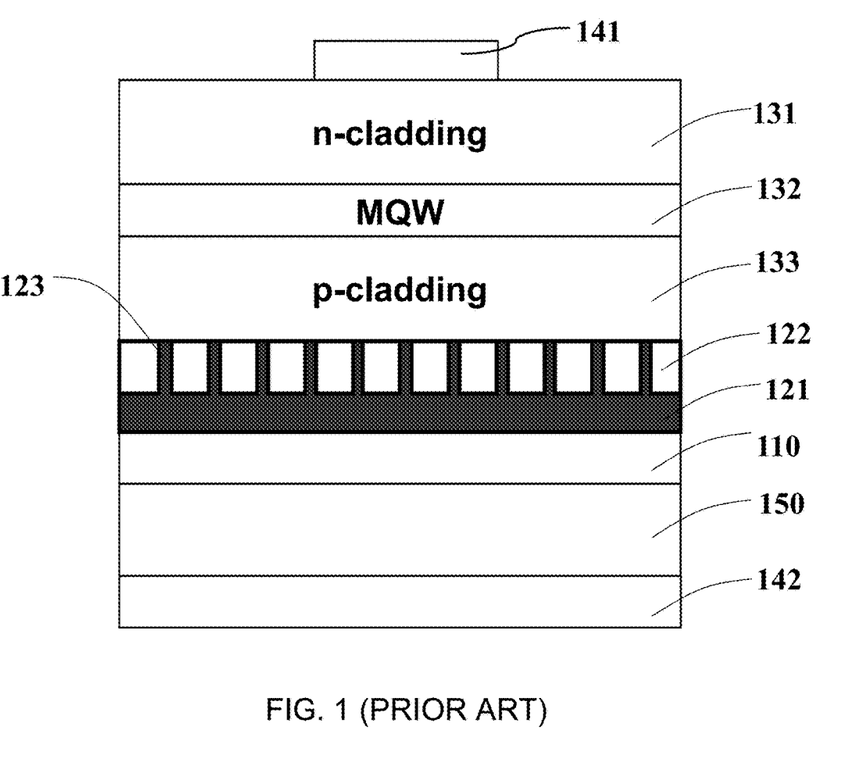
FIG. 1 illustrate a side sectional view of a light-emitting diode chip structure in existing technologies.

FIG. 1 shows an existing vertical light-emitting diode structure, which converts the growth substrate to a conductive substrate with a mirror system via bonding technology, thus increasing luminance. In the aforesaid structure, the top-surface electrode generally shields the conductive through-holes under the light-emitting epitaxial laminated layer, so that some light cannot be emitted, and therefore influence chip luminance.

In existing technology, to avoid overlap of the top-surface electrode and the conductive through-holes under the light-emitting epitaxial laminated layer as much as possible, the top-surface electrode and the bottom ohmic contact electrode are distributed staggered by electrode alignment. For example, the Chinese patent CN103890981A discloses a light-emitting diode, wherein, the ohmic contact electrode 7 is arranged in a position not overlapped with the bonding pad 12a of the surface electrode 12, and in a middle position between linear parts of the ohmic electrode 11. This technical scheme solves the shielding problem of the top-surface electrode. However, on the one hand, it requires electrode alignment, which increases process complexity. In addition, it has high precision requirement of alignment, and any incorrect alignment is easy to cause poor yield. On the other hand, forward voltage value ($V_F$) increases as LOP (Light Output Power) improves.

SUMMARY

To solve the above problems, various embodiments of the present disclosure provide a light-emitting diode chip and fabrication method thereof. A top-surface electrode composed of a bonding pad electrode and a finger-shape electrode are formed over the upper surface of the light-emitting epitaxial laminated layer. A conductive through-hole array is formed over the lower surface of the light-emitting epitaxial laminated layer, with a rotation angle between the conductive through-hole array and the finger-shape electrode. On one hand, this arrangement reduces the number of conductive through-holes that are shielded by the top electrode, which effectively improves the effective utilization rate of the conductive through-hole under the active layer, resulting in increasing light-emitting efficiency and reducing forward voltage value $V_F$; on the other hand, it requires no alignment, which simplifies process and improves product yield.

In one aspect of the present disclosure, a light-emitting diode chip is provided, which includes a light-emitting epitaxial laminated layer having an upper surface and a lower surface opposite to each other, which further includes a first semiconductor layer, a second semiconductor layer, an active layer between them; a dielectric layer having a conductive through-hole array over the lower surface of the light-emitting epitaxial laminated layer; a metal conductive layer over the lower surface of the dielectric layer, which fills up the conductive through-hole and forms ohmic contact with the light-emitting epitaxial laminated layer; a conductive substrate over the lower surface of the metal conductive layer for supporting the light-emitting epitaxial laminated layer; a first electrode comprising a bonding pad electrode and a finger-shape electrode over the upper surface of the light-emitting epitaxial laminated layer. A rotation angle is formed between the conductive through-hole array and the finger-shape electrode, which is selected to prevent a preferred number of conductive through-holes from being shielded by the bonding pad electrode and the finger-shape electrode.

In some embodiments, the rotation angle is 10°-30°.

In some embodiments, the rotation angle is ~23°.

In some embodiments, the preferred number of conductive through-holes is the maximum number.

In some embodiments, the preferred number enables a minimum value of $V_F$.

In some embodiments, the preferred number enables a maximum value of LOP.

In some embodiments, the bonding pad electrode is in the middle of the chip, and the finger-shape electrode extends from the bonding pad electrode to the chip edge region.

In some embodiments, the finger-shape electrode has a central symmetric pattern.

In some embodiments, the center of the finger-shape electrode aligns with that of the conductive through-hole array.

In a second aspect of the present disclosure, a fabrication method of a light-emitting diode is provided, which includes 1) providing a light-emitting epitaxial laminated layer having an upper surface and a lower surface opposite to each other, which further includes a first semiconductor layer, a second semiconductor layer and an active layer between them; 2) fabricating an dielectric layer having a conductive through-hole array over the lower surface of the light-emitting epitaxial laminated layer; 3) fabricating a metal conductive layer over a lower surface of the dielectric layer, which fills up the conductive through-hole, and forms ohmic contact with the light-emitting epitaxial laminated layer; 4) providing a conductive substrate and connecting it to the metal conductive layer for supporting the light-emitting epitaxial laminated layer; and 5) forming a first electrode including a bonding pad electrode and a finger-shape electrode over the upper surface of the light-emitting epitaxial laminated layer, wherein, a rotation angle is formed between the finger-shape electrode and the conductive through-hole array formed in step 2), which is selected to prevent a preferred number of conductive through-holes from being shielded by the bonding pad electrode and the finger-shape electrode.

In some embodiments, step 2) is formed by: covering a dielectric layer over the lower surface of the light-emitting epitaxial laminated layer; providing a photomask plate with a photomask pattern array, wherein, the photomask pattern array is parallel with the photomask plate edge; aligning the photomask plate with the dielectric layer, and rotating the photomask plate to form the aforesaid rotation angle with the dielectric layer for exposure.

In some embodiments, step 2) is formed by: covering a dielectric layer over the lower surface of the light-emitting epitaxial laminated layer; providing a photomask plate with a photomask pattern array, wherein, the photomask pattern array is parallel with the photomask plate edge; aligning the photomask plate with the dielectric layer, and rotating the light-emitting epitaxial laminated layer with a dielectric layer to form the aforesaid rotation angle with the photomask plate for exposure.

In some embodiments, step 2) is formed by: covering a dielectric layer over the lower surface of the light-emitting epitaxial laminated layer; providing a photomask plate with a photomask pattern array, wherein, the aforesaid rotation angle is formed between the photomask pattern array and the photomask plate edge; aligning the photomask plate with the dielectric layer for exposure.

According to a third aspect of the present disclosure, a light-emitting system comprising a plurality of light-emitting diodes is provided. Each light-emitting diode further includes a light-emitting epitaxial laminated layer having an upper surface and a lower surface opposite to each other, which further includes a first semiconductor layer, a second semiconductor layer, an active layer between them; a dielectric layer having a conductive through-hole array over the lower surface of the light-emitting epitaxial laminated layer; a metal conductive layer over the lower surface of the dielectric layer, which fills up the conductive through-hole and forms ohmic contact with the light-emitting epitaxial laminated layer; a conductive substrate over the lower surface of the metal conductive layer for supporting the light-emitting epitaxial laminated layer; a first electrode comprising a bonding pad electrode and a finger-shape electrode over the upper surface of the light-emitting epitaxial laminated layer. A rotation angle is formed between the conductive through-hole array and the finger-shape electrode, which is selected to prevent a preferred number of conductive through-holes from being shielded by the bonding pad electrode and the finger-shape electrode. The light-emitting system can be used in the fields of, for example, lighting, display, and signage.

According to some embodiments of the present disclosure, on the one hand, the conductive through-hole array under the active layer is rotated by a certain angle; as a result, less through-holes are shielded under the bonding pad electrode and the finger-shape electrode, and the ohmic contact area with the epitaxial layer remains unchanged; in addition, high-density through-holes are arranged surrounding the expanding electrodes to shorten current transformation path, resulting in optimized $V_F$ and LOP; on the other hand, no alignment is required between the top-surface electrode and the conductive through-hole during fabrication process, which greatly simplifies process and improves product yield.

Other features and advantages of various embodiments of the present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

In the drawing.

100: light-emitting epitaxial laminated layer; 100a: light-emitting region; 100b: cutting channel; 110: bonding layer; 121: metal conductive layer; 122: transparent dielectric layer; 123: conductive through-hole; 131: first semiconductor layer; 132: active layer; 133: second semiconductor layer; 141: first electrode; 142: second electrode; 150: conductive substrate; 200: photomask plate.

DETAILED DESCRIPTION

The LED chip structure and the fabrication method of the present disclosure will be described in detail with reference to the accompanying drawings, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

Embodiment 1

FIG. 1 illustrates a light-emitting diode chip with a mirror system, which includes a light-emitting epitaxial laminated layer, a bonding layer 110, a metal conductive layer 121, a dielectric layer 122, a first electrode 141, a second electrode 142 and a conductive substrate 150, wherein, the light-emitting epitaxial laminated layer is at least composed of a first semiconductor layer 131, an active layer 132 and a second semiconductor layer 133.

In a case that the first semiconductor layer 131 is a p-type semiconductor, the second semiconductor layer 133 can be a hetero-electric n-type conductor; when the first semiconductor layer 131 is an n-type semiconductor, the second semiconductor layer 133 can be a hetero-electric p-type semiconductor layer. The active layer 132 is between the first semiconductor layer 131 and the second semiconductor layer 133, which can be a neutral, a p-type or an n-type electric semiconductor. When current passes through the light-emitting epitaxial laminated layer, the active layer 132 is triggered to emit light.

In a case that the active layer 132 is made of nitride-based material, blue or green light will be emitted; when made of AlInGaP-based material, red, orange or yellow light in amber color will be emitted. A conductive through-hole array 123 is arranged inside the dielectric layer 122, and the metal conductive layer 121 fills up the conductive through-hole array 123, and forms ohmic contact with the light-emitting epitaxial laminated layer. The metal conductive layer 121 and the dielectric layer 122 form an omni-directional reflector. The first electrode 141 is composed of a bonding pad electrode and a finger-shape electrode, wherein, the bonding pad electrode is in the middle of the chip, and the finger-shape electrode extends from the bonding pad electrode to the chip edge region.

Figure 2:
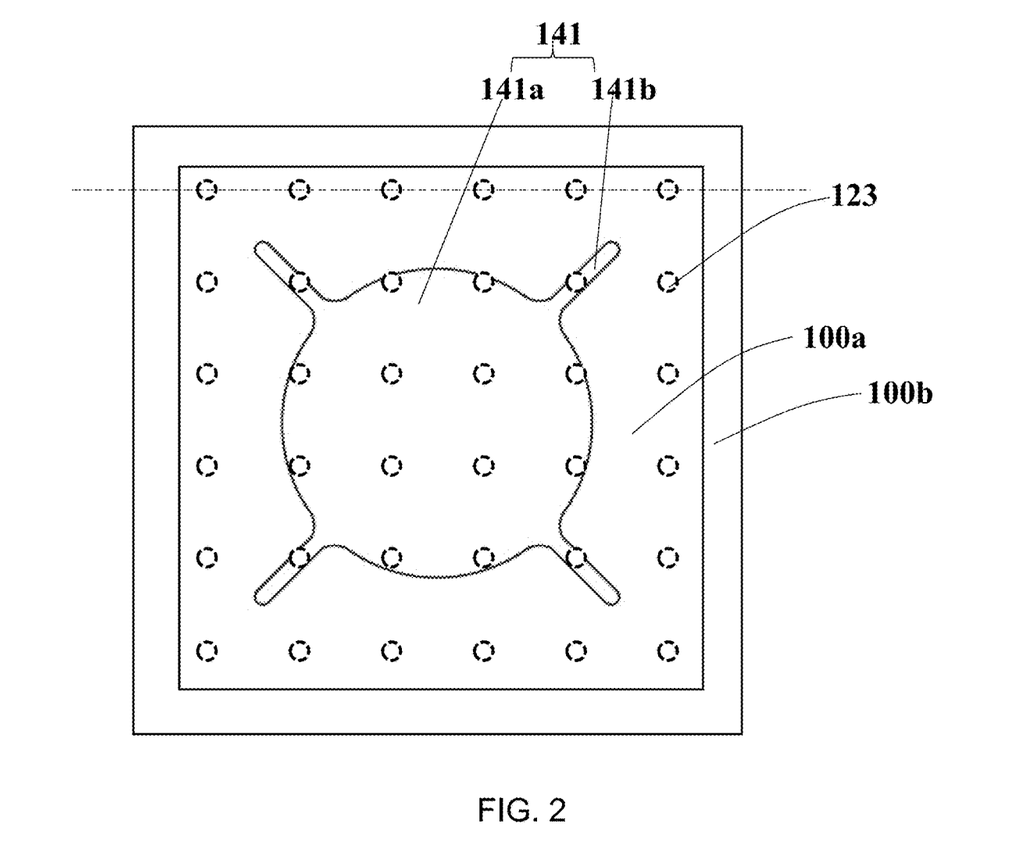
FIG. 2 shows a distribution diagram of the conductive through-hole array of the light-emitting diode chip according to Embodiment 1 of the present disclosure. No rotation angle is formed between the conductive through-hole array and the finger-shape electrode of the top electrode.
Figure 3:
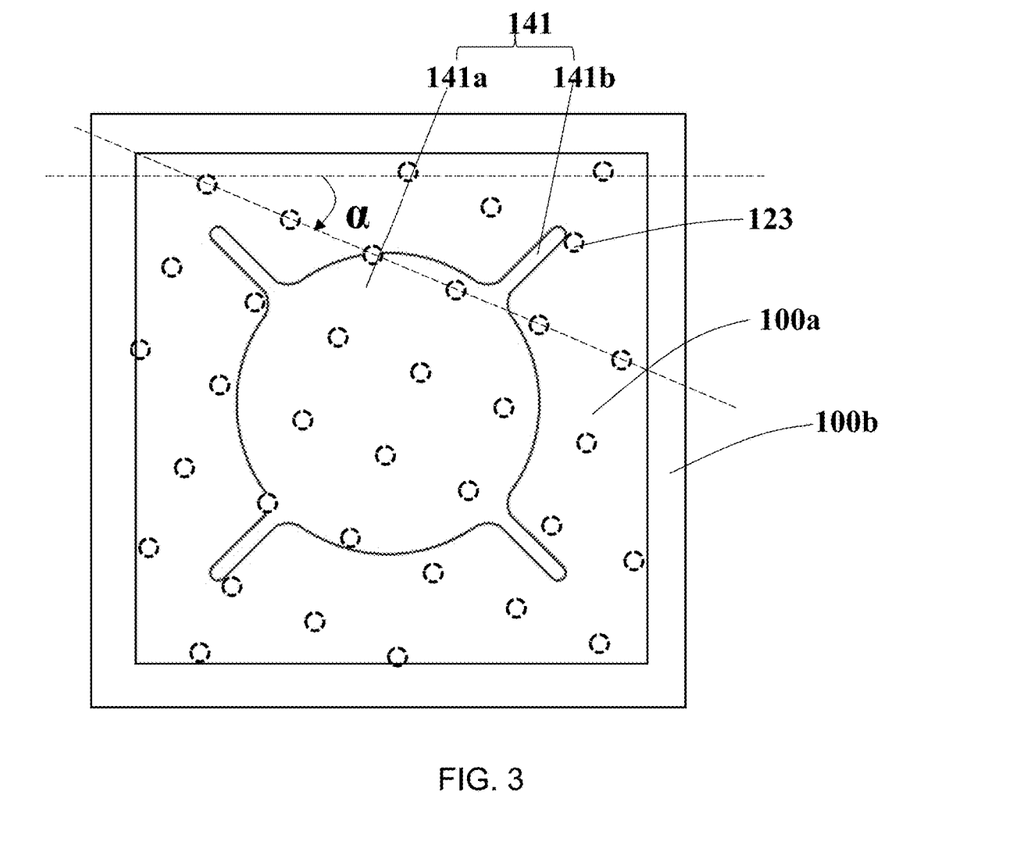
FIG. 3 shows a distribution diagram of the conductive through-hole array of the light-emitting diode chip according to Embodiment 1 of the present disclosure. A rotation angle is formed between the conductive through-hole array and the finger-shape electrode of the top electrode.

FIGS. 2 and 3 show distribution diagrams of two arrangements of conductive through-hole arrays 123. As shown in FIG. 2, no rotation angle is formed between the conductive through-hole array 123 and the finger-shape electrode of the first electrode. In this pattern, a large portion of the conductive through-hole array 123 in the light-emitting region is shielded by the first electrode 141 (among 36 conductive through-holes, 16 are shielded by the bonding pad electrode 141a and the finger-shape electrode 141b of the first electrode, with only 55.6% effective utilization rate). As a result, part of the light cannot be extracted, which reduces chip luminance.

As shown in FIG. 3, a rotation angle α is formed between the conductive through-hole array and the finger-shape electrode. With this rotation angle, on the one hand, less conductive through-holes are shielded under the bonding pad electrode and the finger-shape electrode, thus improving light-emitting intensity LOP of the chip; on the other hand, the ohmic contact area with the epitaxial layer remains unchanged; in addition, high-density through-holes are arranged surrounding the expanding electrodes to shorten current transformation path, thus reducing chip $V_F$ value. Preferably, the rotation angle α is 10-30°.

In this embodiment, in the pattern as shown in FIG. 3, the finger-shape electrode is a central symmetric pattern, and the center of the finger-shape electrode aligns with the conductive through-hole array center. The rotation angle α between the conductive through-hole array and the finger-shape electrode of the top electrode is 23°. Among 34 conductive through-holes in the lighting region 100a, 10 are shielded by the bonding pad electrode 141a and the finger-shape electrode 141b of the first electrode. As a result, less conductive through-holes are shielded under the finger-shape electrode 141a while the ohmic contact area between the second semiconductor layer 132 and the metal conductive layer remains basically unchanged; therefore, effective utilization rate of conductive through-holes is improved to 76.6%, thus improving arrangement density of effective conductive through-holes and uniformity of current spreading. Meanwhile, conductive through-holes are arranged surrounding the finger-shape electrode 141a at short distance, which shortens current transfer path and reduces chip $V_F$ value.

Further, in the pattern as shown in FIG. 3, after the conductive through-hole array 123 is rotated by 23°, the arrangement of conductive holes are similar to a hexagonal close-packed arrangement inclined at certain angle, which increases light extraction.

Taking AlInGaP-based light-emitting diode as an example, the first semiconductor layer 131 is an n-type semiconductor, and the second semiconductor layer 133 is a p-type conductor, where $V_F$ and LOP of the light-emitting diode chip are tested based on distribution diagrams of different conductive through-hole array. Specifically, no rotation angle is formed between the conductive through-hole array and the finger-shape electrode of the first electrode (as shown in FIG. 2); or 23° is rotated between the conductive through-hole array and the finger-shape electrode of the first electrode (as shown in FIG. 3); or 30° is rotated between the conductive through-hole array and the finger-shape electrode of the first electrode. Test results are as shown in Table 1.

TABLE 1

| Rotation angle α | $V_F$ (V) | LOP (mcd) | WD (nm) | LOP (%) | $\Delta V_F$ |
|---|---|---|---|---|---|
| 0° | 2.15 | 322.7 | 621.2 | 1.00 | 0 |
| 23° | 2.14 | 331.8 | 621.3 | 1.03 | 0.01 |
| 30° | 2.12 | 328.3 | 621.3 | 1.00 | 0.02 |

As the above table shown, when the conductive through-hole array in the light-emitting diode chip structure as shown in FIG. 1 is rotated, LED chip luminance is improved and $V_F$ is reduced at certain level.

Embodiment 2

Figure 4:
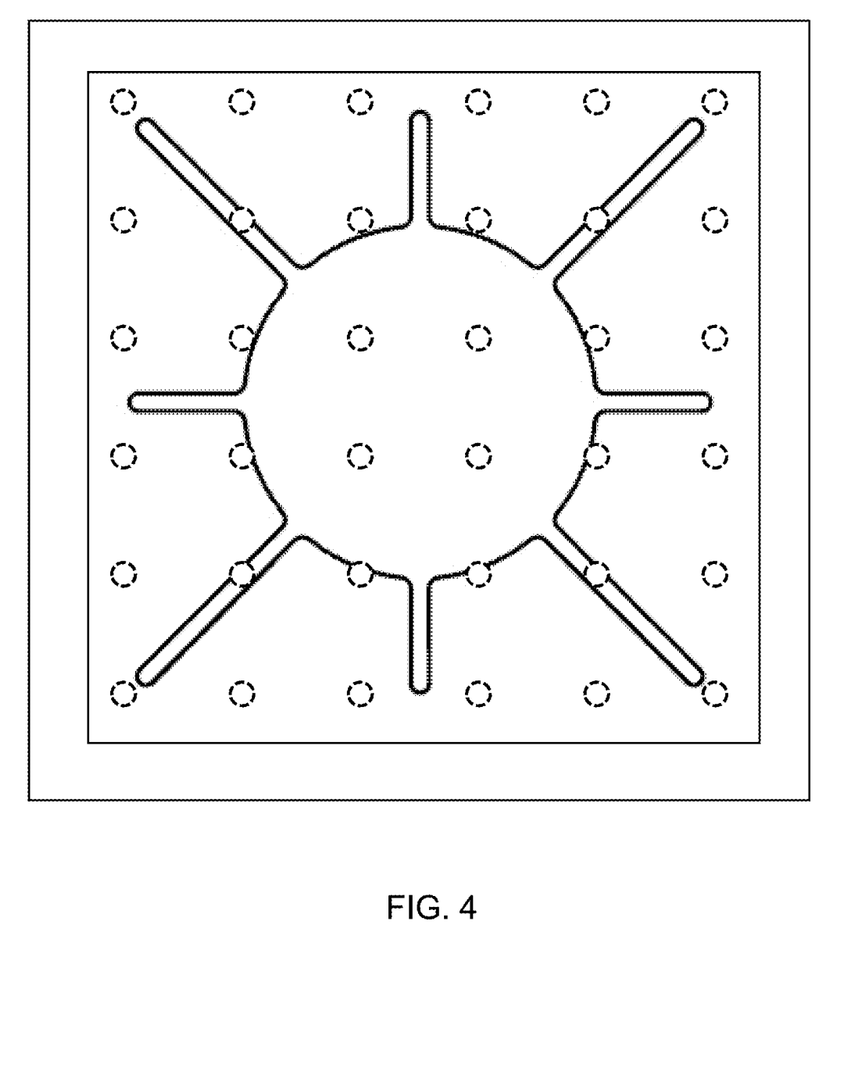
FIG. 4 shows a distribution diagram of the conductive through-hole array of the light-emitting diode chip according to Embodiment 2 of the present disclosure. No rotation angle is formed between the conductive through-hole array and the finger-shape electrode of the top electrode.
Figure 5:
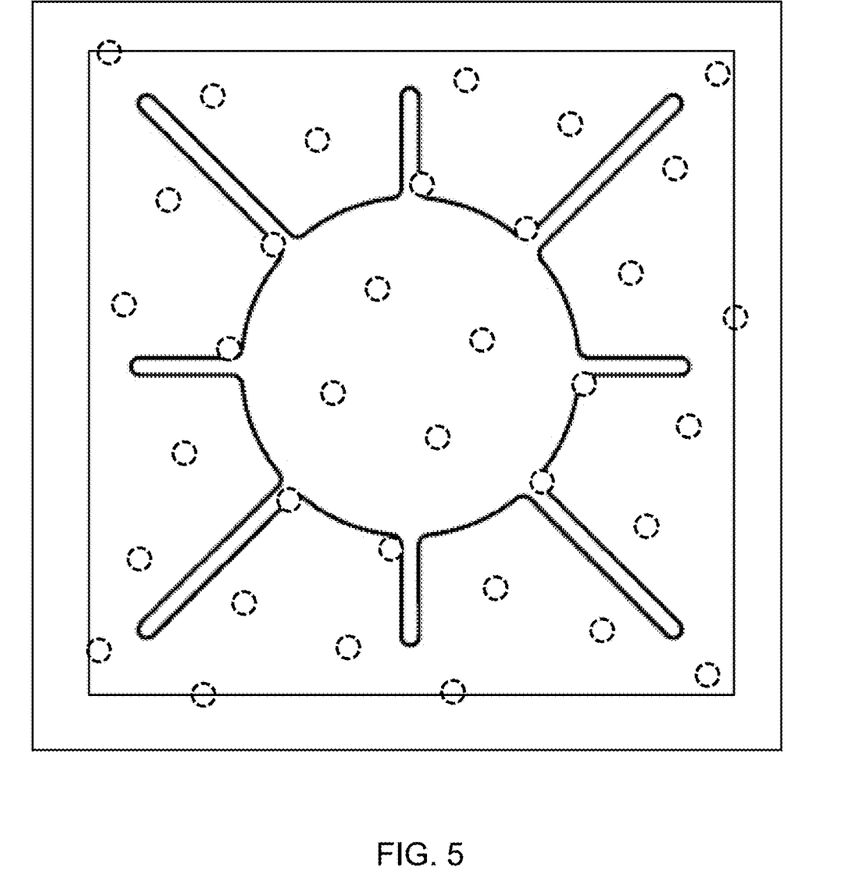
FIG. 5 shows a distribution diagram of the conductive through-hole array of the light-emitting diode chip according to Embodiment 2 of the present disclosure. A rotation angle is formed between the conductive through-hole array and the finger-shape electrode of the top electrode.

The difference between this embodiment and Embodiment 1 is the shape of the first electrode of the light-emitting diode chip, as shown in FIGS. 4-5. In the pattern as shown in FIG. 4, no rotation angle is formed between the conductive through-hole array and the finger-shape electrode of the first electrode, wherein, among 36 conductive through-holes in the light-emitting region, 8 are shielded by the first electrode, resulting in only 77.8% effective utilization rate. In the pattern as shown in FIG. 5, a rotation angle of 23° is formed between the conductive through-hole array and the top first electrode, wherein, among 35 conductive through-holes in the light-emitting region 100a, only 4 are completely shielded by the first electrode, with effective utilization rate of 88.9%.

Embodiment 3

This embodiment discloses a fabrication method for the light-emitting diode chip as shown in Embodiments 1-2, including S100-S500. Details are as followed.

Figure 6:
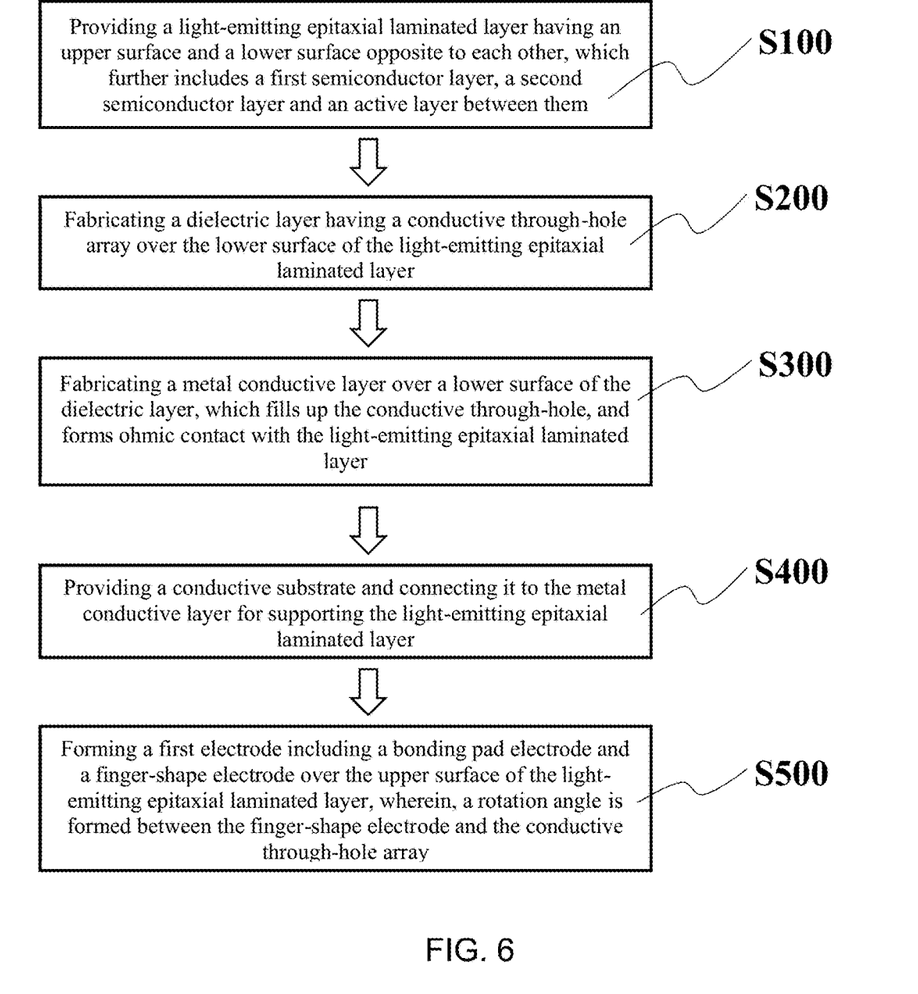
FIG. 6 shows a flow chart for fabricating a light-emitting diode chip according to the present disclosure.

S100: provide a light-emitting epitaxial laminated layer, including at least a first semiconductor layer 131, an active layer 132 and a second semiconductor layer 133, which is generally formed over sapphire or gallium arsenide growth substrate. This light-emitting epitaxial laminated layer can be a common structure, preferably with an easily-removed growth substrate.

Figure 7:
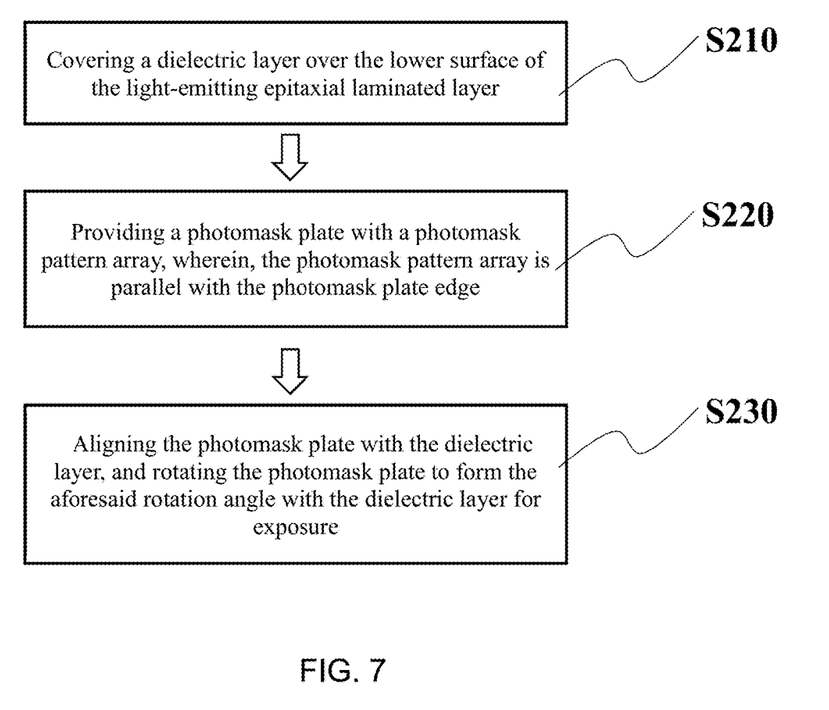
FIG. 7 shows a partial flow diagram for fabricating a light-emitting diode according to Embodiment 3 of the present disclosure.
Figure 8:
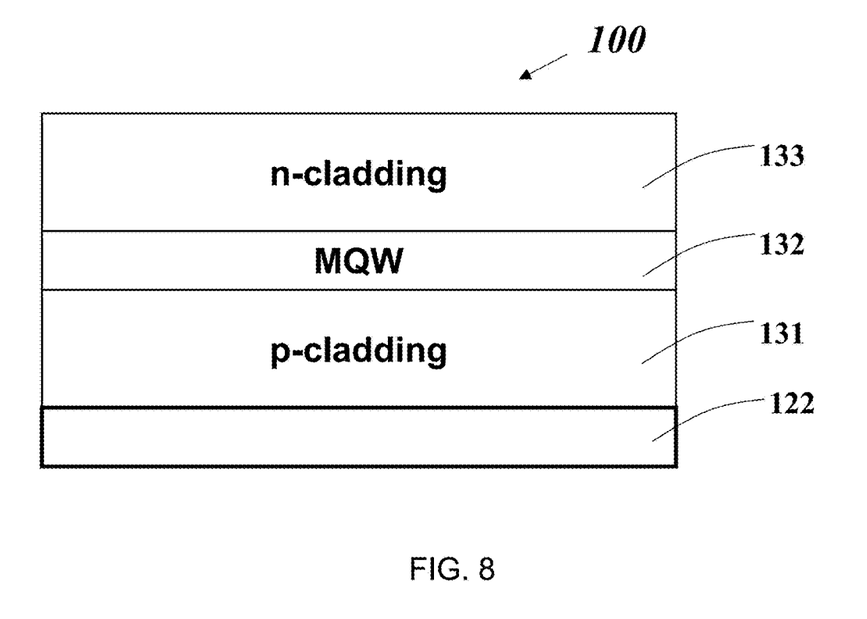
FIG. 8 shows a partial sectional view for fabricating a light-emitting diode according to Embodiment 3 of the present disclosure.
Figure 9:
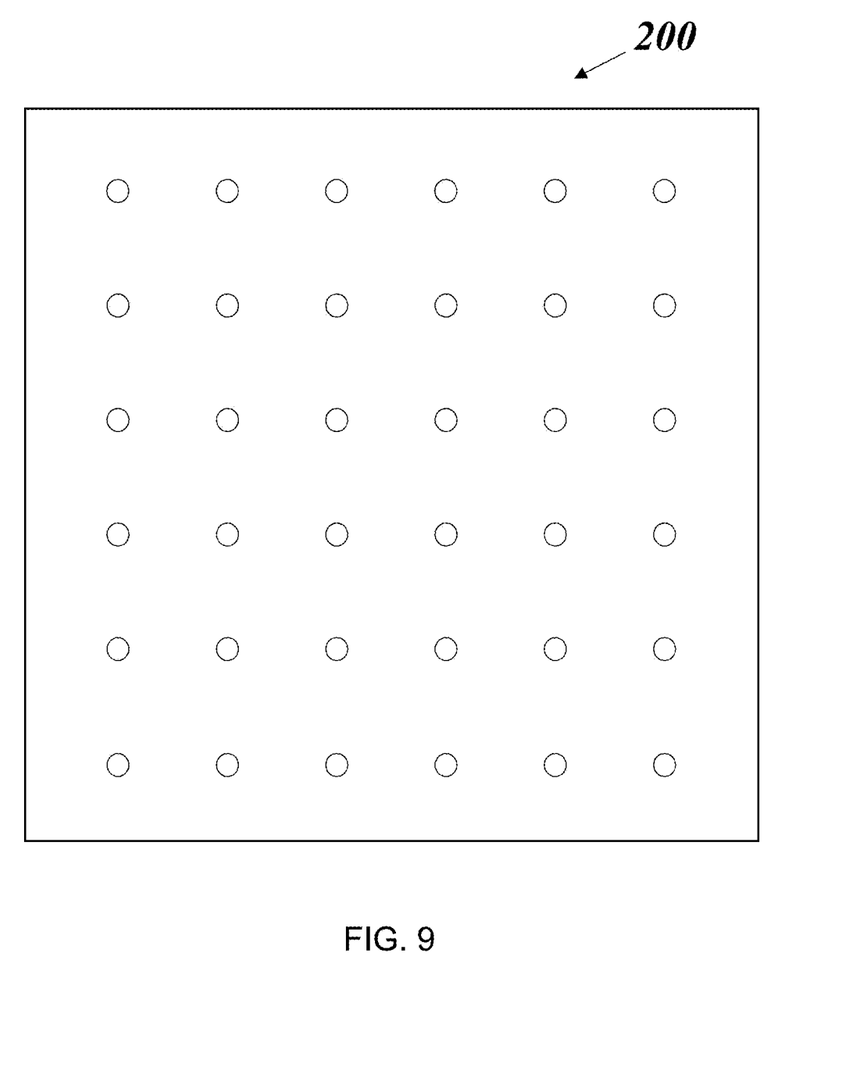
FIG. 9 illustrates a top view of the photomask plate for forming conductive through-hole arrays in Embodiment 3.
Figure 10:
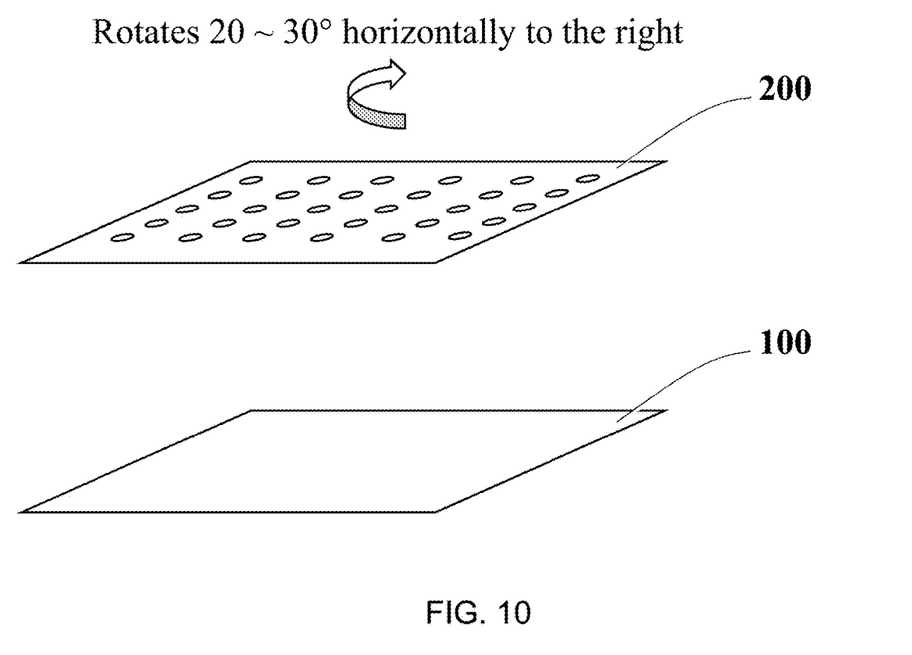
FIG. 10 shows alignment and rotation of the photomask plate and the dielectric layer during fabrication of the light-emitting diode of Embodiment 3.
Figure 11:
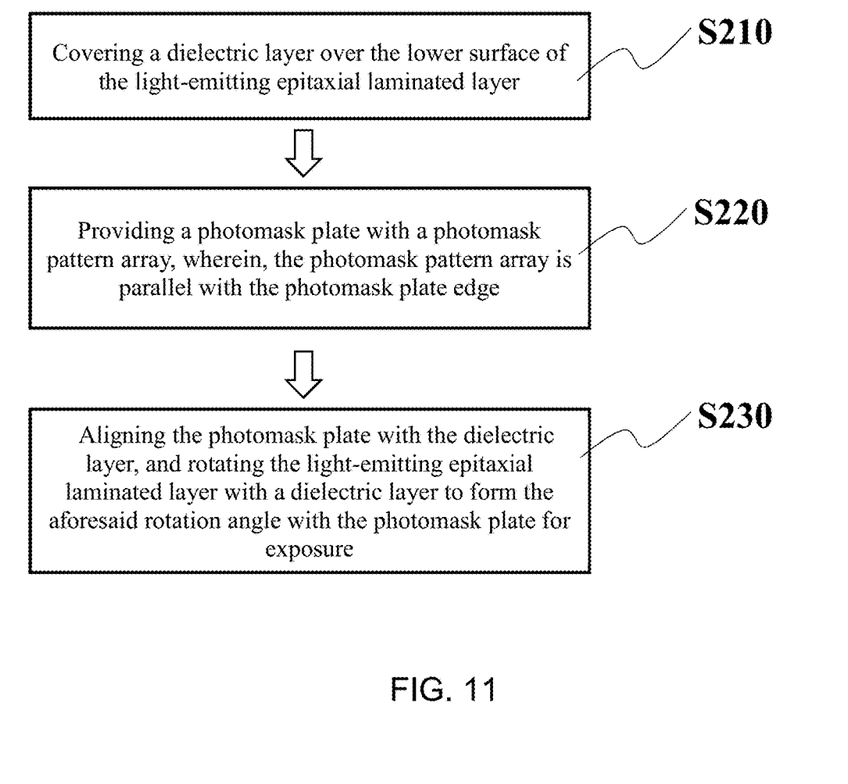
FIG. 11 shows a partial flow diagram for fabricating a light-emitting diode according to Embodiment 4 of the present disclosure.

S200: fabricate a dielectric layer 122 having a conductive through-hole array 123 over the lower surface of the light-emitting epitaxial laminated layer 100. FIG. 7 shows specific method of this step. First, deposit a transparent insulating material layer as the dielectric layer, such as $SiO_2$, over the lower surface of the light-emitting epitaxial laminated layer 100, as shown in FIG. 8; Second, form conductive through-hole arrays via lithographic etching process. Specifically, as shown in FIG. 9, provide a photomask plate 200 with a photomask pattern array, wherein, the photomask pattern array is parallel with the photomask plate edge. Third, as shown in FIG. 10, align the photomask plate 200 with the dielectric layer 122, and rotate the photomask plate 200 so that a rotation angle α is formed between the photomask plate and the dielectric layer for exposure.

In this way, a conductive through-hole array 123 with a rotation angle is obtained, thus forming a rotation angle between the conductive through-hole array 123 and the first electrode 141 subsequently formed over the upper surface of the light-emitting epitaxial laminated layer. As a result, a maximum number of conductive through-holes in the light-emitting region are not shielded by the first electrode. In this embodiment, effective area of the pattern array of the photomask plate 200 shall be larger than the chip size.

S300: fabricate a metal conductive layer 121 over the surface of the dielectric layer 122, which fills up the conductive through-hole and forms ohmic contact with the light-emitting epitaxial laminated layer 100. The metal conductive layer 123 can be materials with good conductivity and reflectivity, such as Al, Ag and other metals.

S400: provide a conductive substrate 150, and connect it to the metal conductive layer 121 for supporting the light-emitting epitaxial laminated layer 100, wherein, the conductive substrate can be Si substrate and can be connected to the metal bonding layer 110 via metal bonding.

S400: fabricate a first electrode 141 including a bonding pad electrode 141a and a finger-shape electrode 141b over the upper surface of the light-emitting epitaxial laminated layer 100, wherein, the bonding pad electrode is in the middle of the chip, and the finger-shape electrode extends from the bonding pad electrode to the chip edge region.

In this embodiment, when a conductive through-hole array is formed in the dielectric layer 122, a conventional photomask plate is used. The utilization density of conductive through-holes can be improved by just rotating the angle of the photomask plate, and the process is simple and requires no electrode alignment.

Embodiment 4

The difference between this embodiment and Embodiment 3 is in step S200.

Referring to FIG. 10, when a conductive through-hole array is fabricated, use the photomask plate as shown in FIG. 9. When the photomask plate is aligned with the dielectric layer, rotate the light-emitting epitaxial laminated layer to form a rotation angle α between the dielectric layer and the photomask plate pattern array for exposure.

Embodiment 5

The difference between this embodiment and Embodiment 3 is in step S200.

Figure 12:
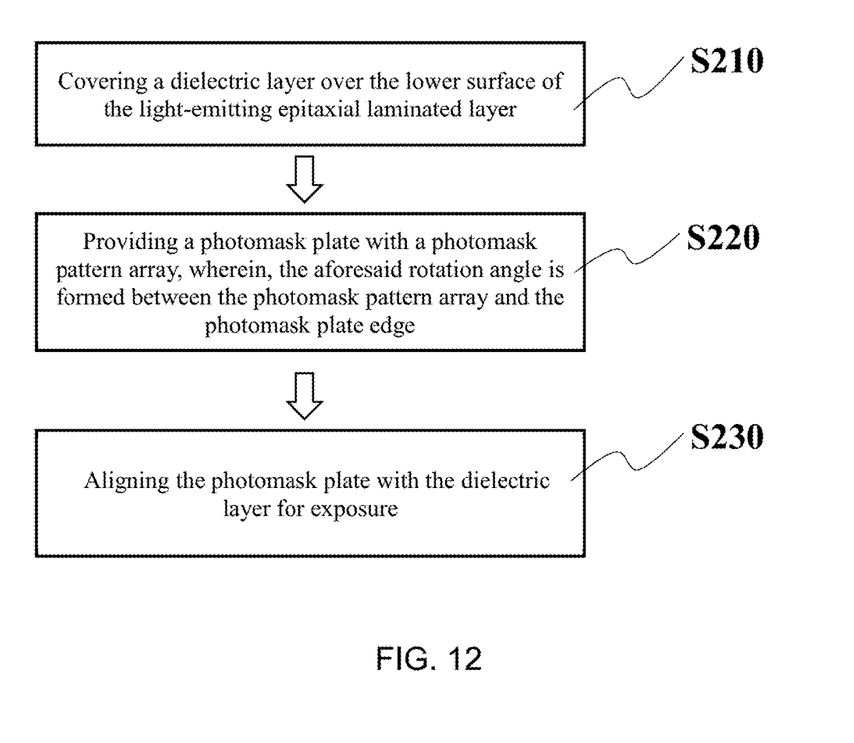
FIG. 12 shows a partial flow diagram for fabricating a light-emitting diode according to Embodiment 5 of the present disclosure.
Figure 13:
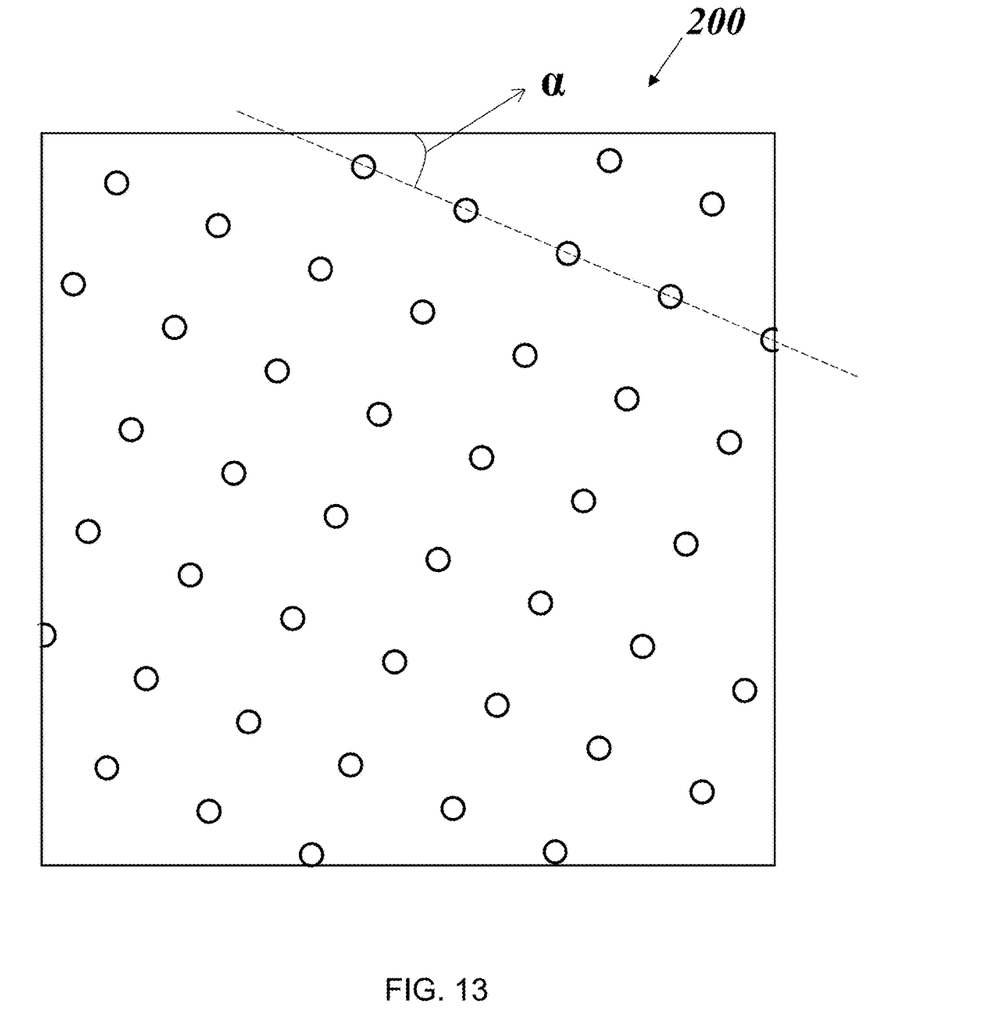
FIG. 13 shows the photomask plate for forming conductive through-hole arrays in Embodiment 5.

Referring to FIG. 12, first, deposit a dielectric layer 122 over the lower surface of the light-emitting epitaxial laminated layer 100, and form a conductive through-hole array 123 via photomask etching process. Specifically: provide a photomask plate 200 with a photomask pattern array, wherein, a rotation angle α is formed between the photomask pattern array and the photomask plate edge, as shown in FIG. 13; align the photomask plate 200 with the dielectric layer 122 for exposure.

In this embodiment, the pattern array of the photomask plate has a rotation angle, which further simplifies process as the subsequent auto machine process is unchanged.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a light-emitting diode, comprising:
    1) providing a light-emitting epitaxial laminated layer having an upper surface and an opposing lower surface, including a first semiconductor layer, a second semiconductor layer and an active therebetween;
    2) fabricating a dielectric layer having a conductive through-hole array comprising a plurality of uniformly-distributed conductive through-holes over the lower surface of the light-emitting epitaxial laminated layer;
    3) fabricating a metal conductive layer over a lower surface of the dielectric layer and filling up the plurality of uniformly-distributed conductive through-holes, forming ohmic-contact with the light-emitting epitaxial laminated layer;
    4) providing a conductive substrate and connecting the conductive substrate to the metal conductive layer for supporting the light-emitting epitaxial laminated layer; and
    5) forming a first electrode comprising a bonding pad electrode and a finger-shaped electrode over the upper surface of the light-emitting epitaxial laminated layer, wherein, a rotation angle is formed between the finger-shaped electrode and the conductive through-hole array formed in step 2), wherein the rotation angle is selected to prevent a preferred number of conductive through-holes from being shielded by the bonding pad electrode and the finger-shape electrode.

2. The fabrication method of claim 1, wherein, step 2) further comprises:
    covering a dielectric layer over the lower surface of the light-emitting epitaxial laminated layer;
    providing a photomask plate with a photomask pattern array, wherein, the photomask pattern array is parallel with the photomask plate edge;
    aligning the photomask plate with the dielectric layer; and
    rotating the light-emitting epitaxial laminated layer with the dielectric layer to form the rotation angle with the photomask plate for exposure.

3. The fabrication method of claim 1, wherein, step 2) further comprises:

covering a dielectric layer over the lower surface of the light-emitting epitaxial laminated layer;
providing a photomask plate with a photomask pattern array, wherein, the photomask pattern array is parallel with the photomask plate edge;
aligning the photomask plate with the dielectric layer; and
rotating the photomask plate to form the rotation angle with the dielectric layer for exposure.

4. The fabrication method of claim 1, wherein, step 2) further comprises:
covering a dielectric layer over the lower surface of the light-emitting epitaxial laminated layer;
providing a photomask plate with a photomask pattern array, wherein, the rotation angle is formed between the photomask pattern array and the photomask plate edge;
aligning the photomask plate with the dielectric layer for exposure.

5. The fabrication method of claim 1, wherein, a center of the finger-shape electrode aligns with that of the conductive through-hole array.

6. The fabrication method of claim 1, wherein, the finger-shape electrode is a central symmetric pattern.

7. The fabrication method of claim 1, wherein, the preferred number enables a maximum value of LOP.

8. The fabrication method of claim 1, wherein, the preferred number enables a minimum value of $V_F$.

9. The fabrication method of claim 1, wherein, the preferred number is the maximum number.

10. The fabrication method of claim 1, wherein, the rotation angle is about 23°.

11. The fabrication method of claim 1, wherein, the rotation angle is 10°-30°.

12. A light-emitting diode, comprising:
a light-emitting epitaxial laminated layer having an upper surface and an opposing lower surface, including: a first semiconductor layer, a second semiconductor layer, and an active layer therebetween;
a dielectric layer having a conductive through-hole array comprising a plurality of uniformly-distributed conductive through-holes over the lower surface of the light-emitting epitaxial laminated layer;
a metal conductive layer over a lower surface of the dielectric layer and filling up the plurality of uniformly-distributed conductive through-holes, forming ohmic-contact with the light-emitting epitaxial laminated layer;
a conductive substrate over a lower surface of the metal conductive layer for supporting the light-emitting epitaxial laminated layer; and
a first electrode comprising a bonding pad electrode and a finger-shaped electrode over the upper surface of the light-emitting epitaxial laminated layer;
wherein, a rotation angle is formed between the conductive through-hole array and the finger-shaped electrode, wherein the rotation angle is selected to prevent a preferred number of conductive through-holes from being shielded by the bonding pad electrode and the finger-shape electrode.

13. The light-emitting diode of claim 12, wherein, a center of the finger-shape electrode aligns with that of the conductive through-hole array.

14. The light-emitting diode of claim 12, wherein, the finger-shape electrode is a central symmetric pattern.

15. The light-emitting diode of claim 12, wherein, the preferred number enables a maximum value of LOP.

16. The light-emitting diode of claim 12, wherein, the preferred number enables a minimum value of $V_F$.

17. The light-emitting diode of claim 12, wherein, the preferred number is a maximum number.

18. The light-emitting diode of claim 12, wherein, the rotation angle is 10°-30°.

19. The light-emitting diode of claim 18, wherein: the rotation angle is about 23°.

20. A light-emitting system comprising a plurality of light-emitting diodes, each light-emitting diode including:
a light-emitting epitaxial laminated layer having an upper surface and an opposing lower surface, including: a first semiconductor layer, a second semiconductor layer, and an active layer therebetween;
a dielectric layer having a conductive through-hole array comprising a plurality of uniformly-distributed conductive through-holes over the lower surface of the light-emitting epitaxial laminated layer;
a metal conductive layer over a lower surface of the dielectric layer and filling up the plurality of uniformly-distributed conductive through-holes, forming ohmic-contact with the light-emitting epitaxial laminated layer;
a conductive substrate over a lower surface of the metal conductive layer for supporting the light-emitting epitaxial laminated layer; and
a first electrode comprising a bonding pad electrode and a finger-shaped electrode over the upper surface of the light-emitting epitaxial laminated layer;
wherein, a rotation angle is formed between the conductive through-hole array and the finger-shaped electrode, wherein the rotation angle is selected to prevent a preferred number of conductive through-holes from being shielded by the bonding pad electrode and the finger-shape electrode.

* * * * *